United States Patent [19]

Linker, Sr. et al.

[11] Patent Number: 5,601,123
[45] Date of Patent: *Feb. 11, 1997

[54] SOJ REFORMING AND RECONDITIONING METHOD AND APPARATUS

[75] Inventors: Frank V. Linker, Sr., Springfield; Tim Claffey, Glen Mills, both of Pa.

[73] Assignee: American Tech Manufacturing Corporation, Glenolden, Pa.

[*] Notice: The portion of the term of this patent subsequent to Apr. 16, 2013, has been disclaimed.

[21] Appl. No.: 405,526

[22] Filed: Mar. 16, 1995

Related U.S. Application Data

[63] Continuation of Ser. No. 48,666, Apr. 16, 1993, Pat. No. 5,431,197.
[51] Int. Cl.⁶ .................................................. B21F 45/00
[52] U.S. Cl. ................................................... 140/147
[58] Field of Search ...................... 140/105, 147; 29/827, 874, 882

[56] References Cited

U.S. PATENT DOCUMENTS

| | | | |
|---|---|---|---|
| 3,880,205 | 4/1975 | Linker et al. | 140/147 |
| 4,829,669 | 5/1989 | Nakajima | 140/105 |
| 5,375,320 | 12/1994 | Kinsman et al. | 29/827 |

*Primary Examiner*—Lowell A. Larson
*Attorney, Agent, or Firm*—Eugene E. Renz, Jr.

[57] ABSTRACT

A method for aligning leads of an SOJ device having a body portion and a plurality of leads extending from the body portion having inwardly curled terminal ends consisting of the steps of supporting the component body between an anvil having reforming surfaces overlying the rows of leads and a trackway. Moving slide assemblies having a plurality of spaced confronting fingers interengaging between the rows of leads on either side of body portion of the SOJ device first through a combing cycle to space the adjacent leads a predetermined distance relative to one another and then engaging between the curled terminal ends and displacing the slide assemblies transversely relative to the trackway to engage the terminal ends with the reforming surfaces and then reversing the direction movement of the SOJ device to recurl the terminal ends of the leads in the opposing row.

The method, system and apparatus of the present invention involves actuation of the slide assemblies in a controlled sequence to provide shoulder entry and combing up through the leads and then confining the leads in the reforming pockets to produce precise recurling of the terminal ends.

11 Claims, 14 Drawing Sheets

SOJ REFORMING AND RECONDITIONING METHOD AND APPARATUS

This is a continuation of application Ser. No. 08/048,666 filed on Apr. 16, 1993, now Pat. No. 5,431,197 granted Jul. 11, 1954.

FIELD OF THE INVENTION

The present invention relates generally to improvements in apparatus and method for reconditioning or reforming electronic components of the type commonly referred to as SOJ devices which is an acronym for "small outline J lead." These devices comprise a generally rectangular body of a plastic having rows of leads which extend from opposite sides of the body which are of curled configuration or J-shape. The apparatus and method of the present invention are particularly suited for reforming and aligning the J-shaped leads so that certain tolerances described hereafter are within predetermined, controlled limits necessary for proper assembly to a printed circuit board or the like.

BACKGROUND OF THE INVENTION

DIP devices and particularly the new SOJ device form an important part of the electronics industry. SOJ devices are placed on a printed circuit board which has been silk-screened and treated to define precise locations for the solder pads of the SOJ device leads. The DIP and SOJ devices are required to meet certain standards of uniformity for proper application to a printed circuit board. The configuration of the leads for these devices has gone through many stages in order to simplify and expedite the manufacture and assembly to printed circuit boards or the like. The well known prior art DIP devices include those which have leads depending generally transversely downwardly from opposite side edges of the rectangular plastic body portion which are insertable in openings in the printed circuit board. There are also so-called gull-winged SOIC devices of the type shown in U.S. Pat. No. 5,146,101 owned by AMERICAN TECH MANUFACTURING, Assignee of the present application. This patent as well as other patents listed below show various methods and apparatus particularly suited for straightening, forming and scanning DIP devices:

| Inventor | Patent No. | Issued |
| --- | --- | --- |
| Linker, Jr. et al | 4,686,637 | Aug. 11, 1987 |
| Linker et al | 4,705,152 | Nov. 10, 1987 |
| Linker et al | 4,787,426 | Nov. 29, 1988 |
| Linker, Jr. | 5,113,916 | May 2, 1992 |

These prior apparatus and systems are geared to scanning and forming DIP/SOIC devices of the type described above and are not suitable for straightening and forming SOJ devices because of the peculiar and unique lead shape and configuration.

The SOJ device by reason of its complex lead configuration requires multiple tolerances such as, "lead to lead" and "coplanarity" requirements which the prior art apparatus and systems are not capable of providing. Thus, even though these prior apparatus are extremely useful for the purposes intended and designed specifically for forming and scanning the prior SOIC and DIP devices, the SOJ device presents special tolerance considerations which are admirably met by the apparatus and system of the present invention.

SUMMARY OF THE INVENTION

It has now been discovered that the above and other objects of the present invention may be accomplished in the following manner. Specifically, a lead forming and straightening apparatus has been discovered which contemplates a series of multiple operations at a single station to produce free-formed SOJ devices having a "peak to peak" between the opposing rows of leads within predetermined tolerance limits and the distance of the peaks of the leads to the lower face of the body portion of the SOJ device in a predetermined range. The processing also produces lead coplanarity and a constant "lead to lead" distance S for all adjacent leads so they are parallel to a plane E—E perpendicular to the co-planarity plane.

To this end, the apparatus includes an elongated trackway and means for delivering one SOJ device at a time to a forming station. The forming station includes a pair of co-operating slide assemblies each having a plurality of spaced confronting fingers which engage between the leads of the SOJ device. The guide-rail and trackway at the forming station are of a predetermined configuration to permit cycling of the slide assemblies in a predetermined controlled manner to achieve reforming of the leads so that they fall within the peak to peak and other tolerance limits described above. In a typical reforming cycle, an SOJ device enters the forming and straightening station upside down in a so called "dead bug" orientation on the trackway with the slide assemblies in an inward and lower limit position a "home" position. The guide rail then clamps the SOJ device with a light pressure so that the reforming pockets on the guide-rail overlie the opposing rows of leads. The slide assemblies are then retracted and moved upwardly to comb the leads and in the upper limit position, the fingers are moved inwardly toward one another to engage between the J portion of the leads and engage in the reforming pockets of the guide-rail. The light pressure on the SOJ permits slight movement to accommodate alignment of the fingers with respect to the leads resulting in a gentle combing action without damaging the leads. This limited floating movement also prevents chafing or scratching of the leads which is undesirable.

A greater pressure is then exerted on the guide-rail to securely clamp the SOJ device against the trackway and the slide assemblies are then oscillated for "pin to pin" and sweep and or perpendicularity error. Guide-rail pressure is then reduced again to a light pressure and the slide assemblies as a unit are actuated sideways in one direction to confine the J portion of the leads in the guide reform pocket and establish the co-planarity and peak to body dimension. The slide assemblies are then reversed and moved sideways as a unit to achieve the same recurling and forming action of the J portion of the leads in the pocket for the opposite row of leads. The guide rail pressure is then reduced to zero. The SOJ device is then centered in the trackway and the slide assemblies are returned to a "home" position for the next operational cycle. Consider now the novel method of the present invention as applied to straightening and recurling the leads of SOJ devices. The apparatus includes an escapement mechanism or system which singulates the SOJ device so that they move in an orderly fashion one at a time to the straightening station down stream of the escapement mechanisms. When an SOJ device enters the straightening station, the slide assemblies are in a so-called home position with the fingers disposed below the top face of the SOJ device. The guide rail is then actuated to clamp the SOJ device with a light holding pressure. The slide assemblies are then initially moved outwardly upwardly parallel to one another to engage between the fingers of the rows on either sides of the body portion to comb the J portion of the leads. In the upper limit position, the slide assemblies are actuated inwardly toward one another so that the fingers engage between the curled J terminal ends of the rows of leads and engage in the reforming cavities of the anvil. In this position a greater clamping force is exerted and the leads are oscillated from pin to pin to remove sweep error. After the clamping pressure is reduced to a light pressure and the slide assemblies are moved in unison transversely relative to the track way and anvil, first to the left to recurl the terminal ends of the leads of one row by engagement of all of the leads with the transversely disposed recurling surfaces on one side of the anvil. The slide assemblies are then reversed in an opposite direction to achieve the same recurling action in the recurling faces of the anvil for the opposite row. During this process, the lead to lead and coplanarity and peak to body spacing are reestablished to fall within the prescribed tolerances. The slide assemblies are then returned to home position, the anvil pressure released and the reconditioned SOJ device discharged from the straightening station. The apparatus then singles feeding of the next SOJ device from the singulating station for another straightening operation of the type described above. A logic keyboard for operating the various mechanism of the apparatus of the present invention in predetermined timed sequences is provided which is of relatively standard form. An example of a typical logic keyboard circuitry for achieving controlled operation of the type described herein is shown in Linker U.S. Pat. No. 4,686,637 entitled APPARATUS AND METHOD FOR LEAD INTEGRITY DETERMINATION FOR DIP DEVICES, issued Aug. 11, 1987.

BRIEF DESCRIPTION OF THE DRAWINGS

These and other objects of the present invention and the various features and details of the operation and construction thereof are hereinafter more fully set forth with reference to the accompanying drawings, where.

DETAILED DESCRIPTION OF THE PREFERRED EMBODIMENT

Figure 2:
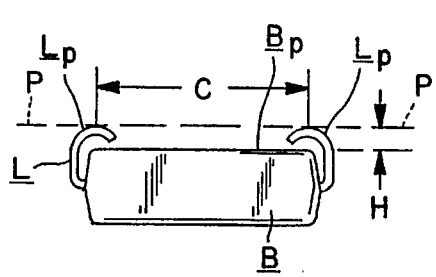
FIG. 2 is a greatly enlarged end elevational view of a SOJ device.
Figure 3:
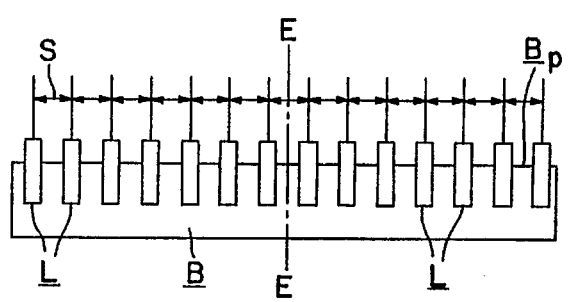
FIG. 3 is a side elevational view of the SOJ device shown in FIG. 2.

The apparatus and method of the present invention are particularly suited and designed for forming and straightening electronic components having J-shaped leads, commonly known in the trade as SOJ devices. The configuration of these devices is best shown in FIGS. 2 and 3 and as illustrated comprise an elongated generally rectangular body portion B made of a molded material, such as a ceramic or plastic, having embedded therein a plurality of J leads L, in the present instance, of J-shaped configuration. The leads L are embedded in the body portion B and extend downwardly. The terminal ends are curled and underlie the bottom face $B_p$ of the body portion of the SOJ device.

SOJ devices are packaged in elongated cartridges and during shipment and handling, the rather delicate leads L tend to bend or deform particularly the end leads of the SOJ device. There are critical tolerances for assembling of SOJ devices onto printed circuit boards (PC boards). For example, the "peak to peak" distance between the opposing rows of leads designated C needs to be within prescribed, predetermined tolerance limits. Additionally, the distance from the peaks $L_p$ of the leads L to the lower face $B_p$ of the SOJ device designated H, needs to be within predetermined predescribed limit and the peaks $L_p$ of all of the leads L needs to be in a common plane P—P also referred to herein as "lead co-planarity". Further, the lead to lead distance S should be a constant for all adjacent leads in the rows of leads and parallel to one another and to a plane E—E transverse to the plane P—P and this is commonly referred to as "perpendicularity". The method and apparatus of the present invention are particularly suited for reconditioning and reforming the leads of SOJ devices so that they fall within the prescribed parameters.

The novel SOJ reconditioning and reforming method and apparatus of the present invention will be described in detail hereafter. However, first a general understanding of the basic structure and operation of the apparatus including broad details of the mechanism may be gained by reference to several of the views which best show the basic components of the apparatus and the operation thereof, such as FIGS. 1, and 4(A)–4(J) inclusive.

Figure 1:
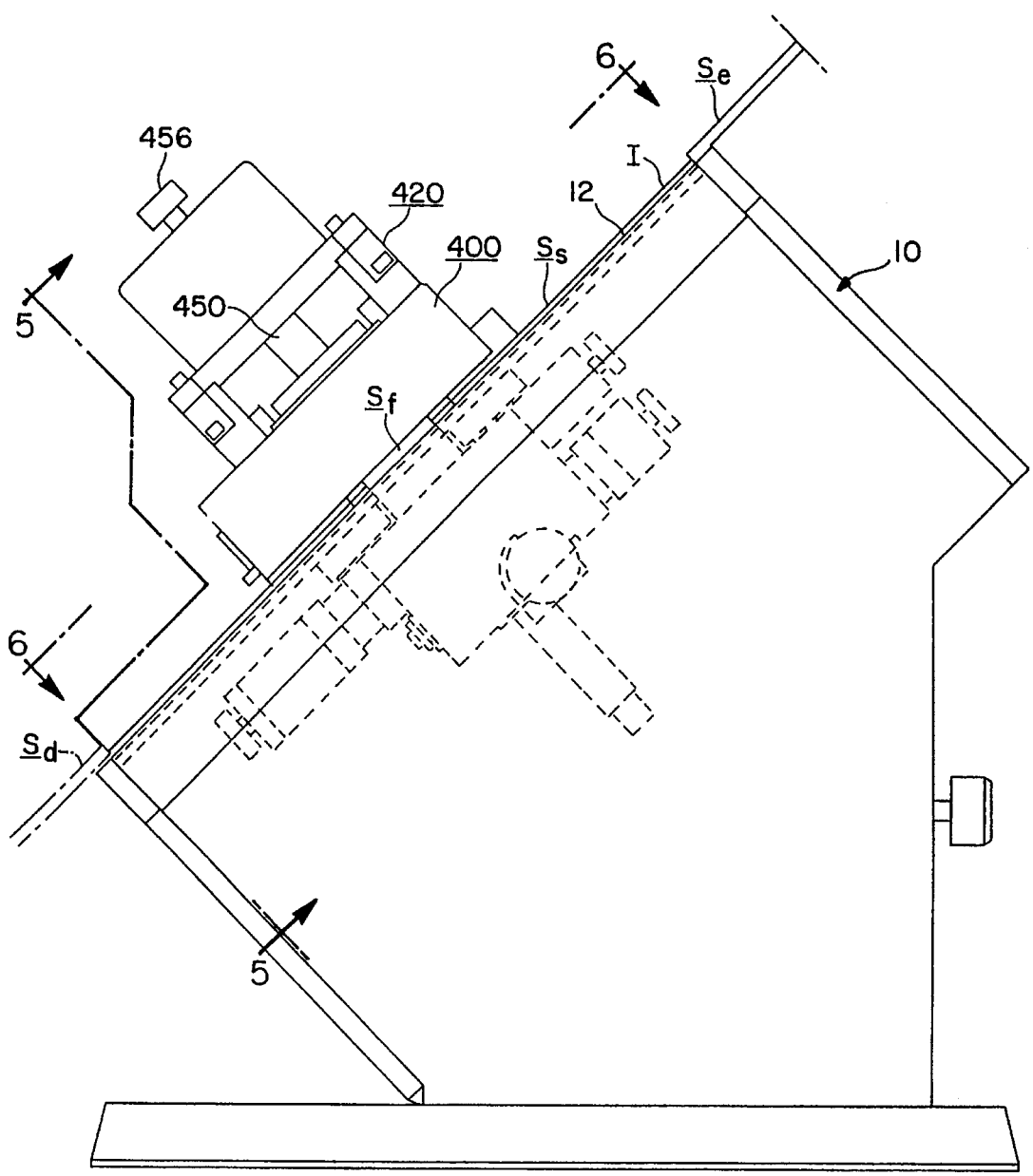
FIG. 1 is a side elevational view of an apparatus for reconditioning leads of an SOJ device.

Considering now the basic components of the entire apparatus in terms of function, the apparatus shown in FIG. 1 comprises a main housing 10 which mounts on its inclined front face 12, an elongated trackway T. Cartridges of SOJ devices are mounted at the upper entrance end of the trackway T at a loading station $S_l$ and discharge SOJ devices in a "dead bug" position or top face down by gravity along the trackway T to a singulating station $S_s$ which releases SOJ devices selectively one at a time to the reconditioning station $S_f$ for processing in a manner described in more detail hereafter. Reformed SOJ devices are discharged and gravity fed to a discharge station $S_d$ which has means for positioning cartridges or tubes to receive the reconditioned and reformed SOJ devices.

Figure 4A:
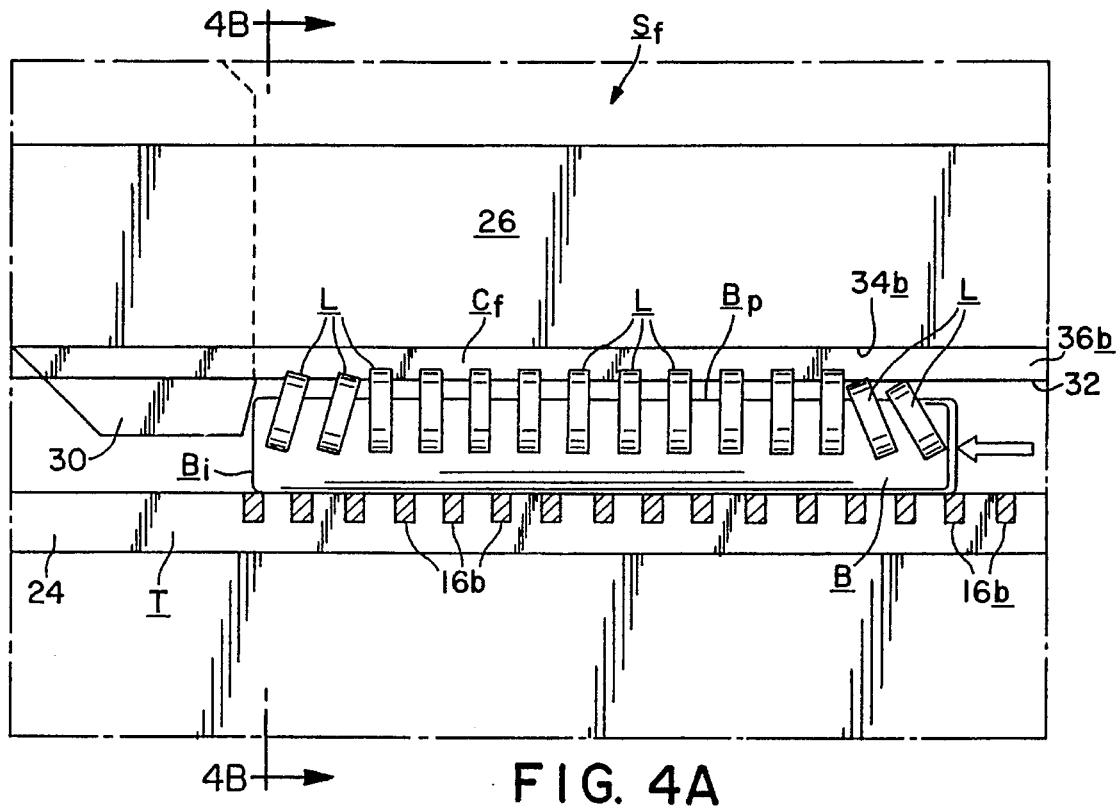
FIG. 4A is a greatly enlarged side elevational fragmentary view showing an SOJ device at the lead straightening and forming station of apparatus in accordance with the present invention and is one of a series of similar view showing the sequence of operations of the device on the SOJ device.
Figure 4B:
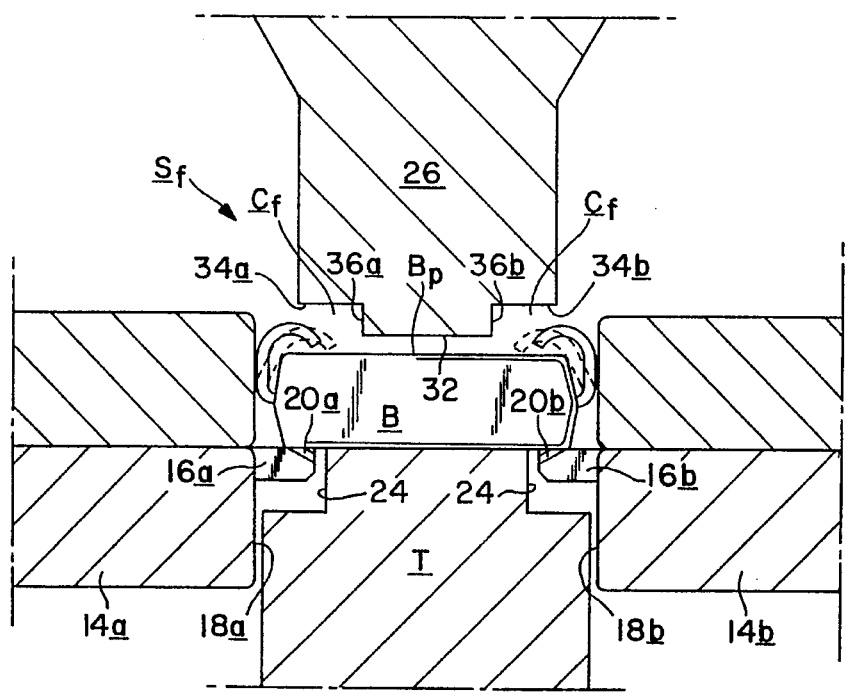
FIG. 4B is a sectional view taken on lines 4B—4B of FIG. 4A showing the home position of the parts of the apparatus and SOJ at the initial start part of the cycle of operation.
Figure 4C:
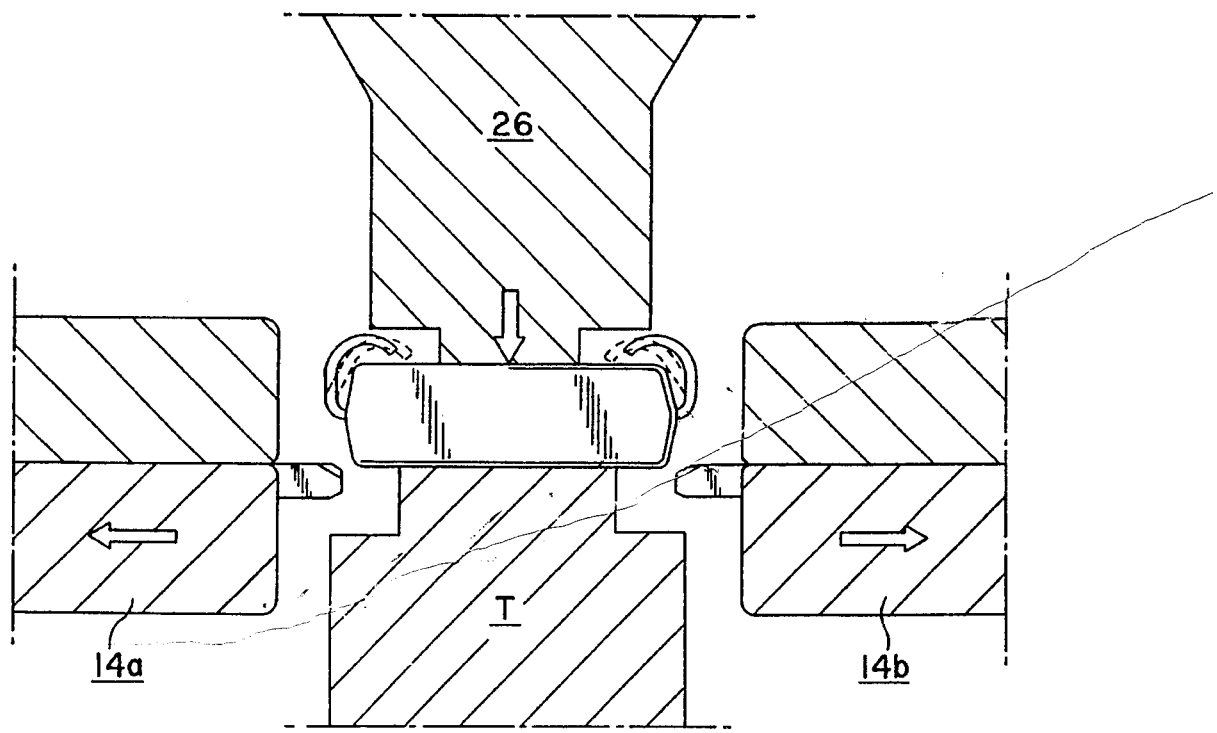
FIG. 4C is sectional view similar to FIG. 4B showing the position of parts of the straightening and forming apparatus in the next cycle of operation with the next phase of the cycle showing the SOJ DIP device clamped to the trackway with light pressure, and the combs of the slide assemblies moving outwardly from the position shown in FIG. 4B.
Figure 4D:
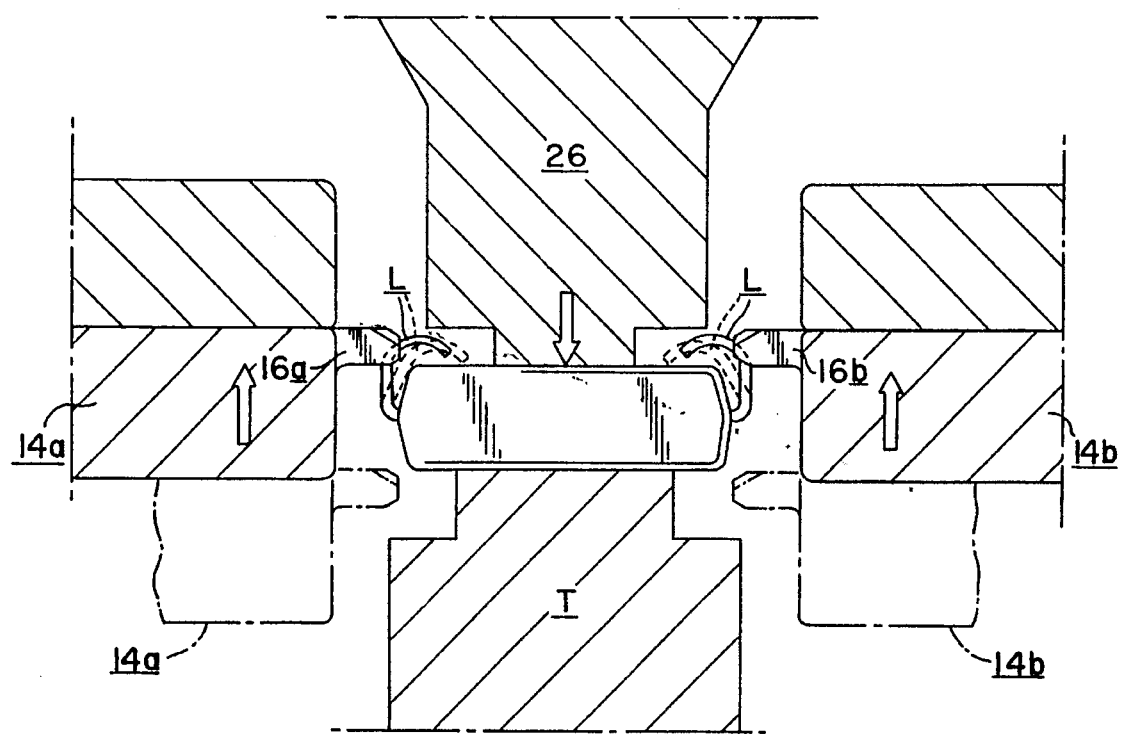
FIG. 4D is a sectional view of the next phase showing illustrating the initial combing operation of the leads to establish the pin to pin tolerance designated S in FIG. 3, the combs of the slide assemblies having moved vertically upwards from the position shown in FIG. 4C.
Figure 4E:
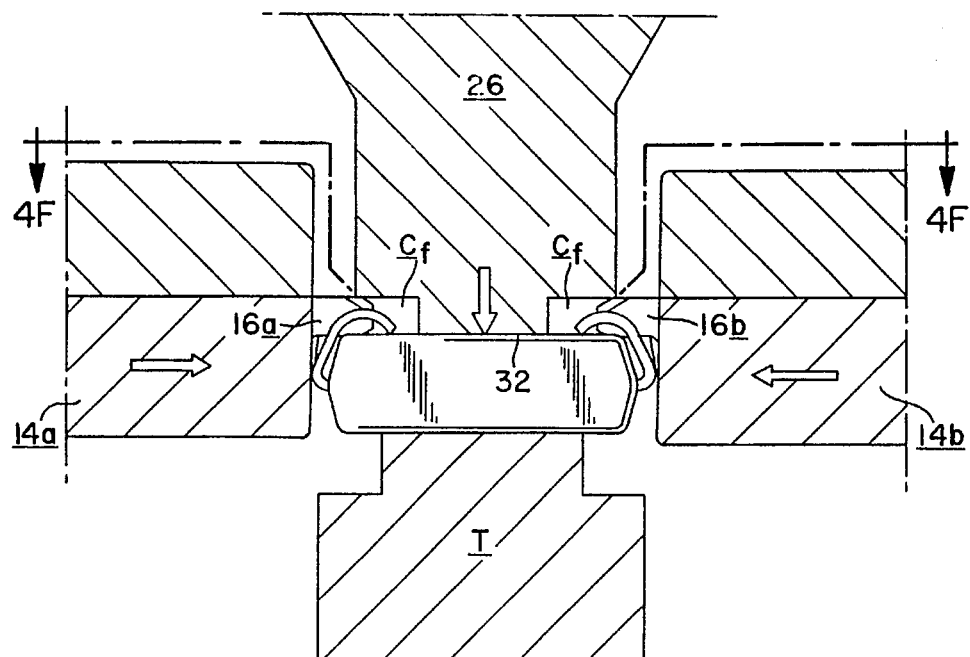
FIG. 4E is a sectional view showing the SOJ device in a clamped position on the trackway with high pressure and the combs moving inwardly toward one another to reduce skew of the leads.
Figure 4F:
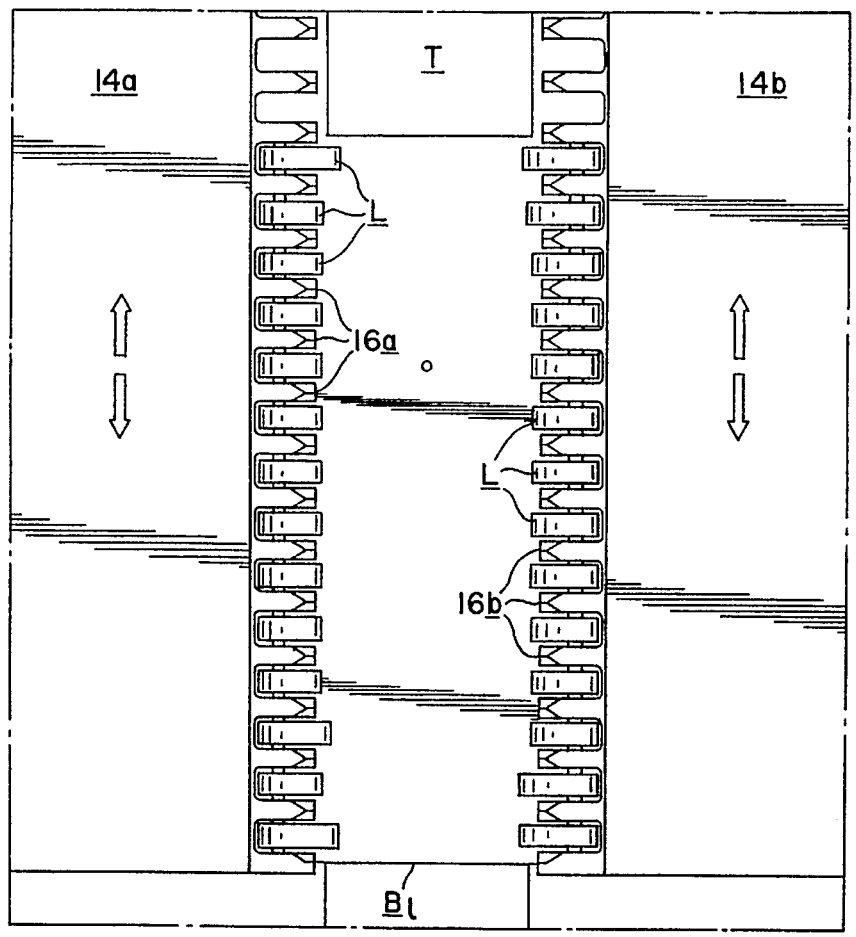
FIG. 4F is a greatly enlarged fragmentary plan view taken on lines 4F—4F of FIG. 4E showing the direction of oscillation of the combs to eliminate spring back in the leads.

The basic components of the mechanism for forming and straightening SOJ devices include as best illustrated in FIGS. 4A–4J inclusive an opposing pair of slide assemblies $14^a$ and $14^b$ having combs comprised of rows of straightening fingers 16a and 16b projecting from confronting faces 18a and 18b. As best illustrated in FIG. 4B and 4F, the terminal ends of the fingers 16a, 16b are bevelled as at $20^a$, $20^b$ to provide a wedging action separating the leads L gently during the lead combing cycle as explained in more detail hereafter. The trackway T at the reconditioning and reforming station $S_f$ is relieved or cut away as at 24 to provide a space for the combs FIGS. 16a, 16b to engage during different phases of the straightening and forming cycle.

An anvil 26 overlies the trackway T and is mounted for reciprocating movement between an upper raised position (FIG. 4B) and a clamping position such as in FIGS. 4C and 4E. A stop latch pin 30 operable between a lowered position (FIG. 4A) to precisely locate an incoming SOJ device at the reconditioning and reforming station $S_f$ and a raised position to permit discharge of processed SOJ device (see FIG. 4J). The lower face of the anvil 26 has a central nose projection 32 which engages the bottom face $B_b$ of the body portion B of the SOJ device between the rows of leads when in a clamping mode. Longitudinally extending cutaways or undercuts $C_f$ on opposite sides of the nose projection 32 define forming faces 34a and $34^b$ generally parallel to the upper face of the trackway T and vertical faces $36^a$ and 36b.

Considering now briefly a typical reconditioning and reforming cycle, an SOJ device to be processed enters the station $S_f$ and engages the stop latch 30 which is in an extended down position to properly orient the SOJ device for reconditioning and reforming (see FIG. 4A). The inner end of the stop 30 is aligned with the inner most finger of the comb to insure interengagement of the fingers between the leads L of the SOJ device and thus, accommodate SOJ devices of various lengths. Note that the stop latch 30 is located to position the lead face $B_l$ of the body portion of the SOJ device so that it aligns the fingers of the comb assembly with the spaces between the leads (see FIG. 4A). It is important to note that the combs underlie the top face of the SOJ body and the anvil 26 is in a raised position i.e., the "home position" of the comb assemblies (see FIG.4B).

The next step in the cycle is to lower the anvil 26 to clamp the SOJ device against the trackway T in a fixed position and to retract the slide assemblies 14a, 14b to withdraw the combs outwardly from the trackway T as shown in FIG. 4C. In this instance the clamping pressure is light in the order of 10 p.s.i. to permit slight adjusting movements of the SOJ device during the combing portion of the cycle. Thereafter, the slide assemblies 14a, 14b are actuated upwardly as shown in FIG. 4D whereby the fingers 16a and 16b engage through the leads L on both sides to separate the leads L and orient them in a generally vertical position relative to the body portion B in the plane E—E. When the slide assemblies 14a, 14b reach the uppermost limit position, they are actuated inwardly toward the trackway T whereby the fingers 14a, 14b engage in the recurling slots or channels $C_f$ on opposite sides of the nose projection 32 of the anvil to the position shown in FIG. 4E. The anvil pressure is then increased to about 60 p.s.i. to securely clamp the SOJ device in a fixed position for the next oscillating phase of the operation. The slide assemblies 16a, 16b are then oscillated in unison in a direction longitudinal to the trackway T in the manner shown in FIG. 4F and when this cycle is completed, the S dimension or the "lead to lead" clearance is reestablished. Oscillation back and forth removes the tendency of the leads L to "spring back".

Figure 4G:
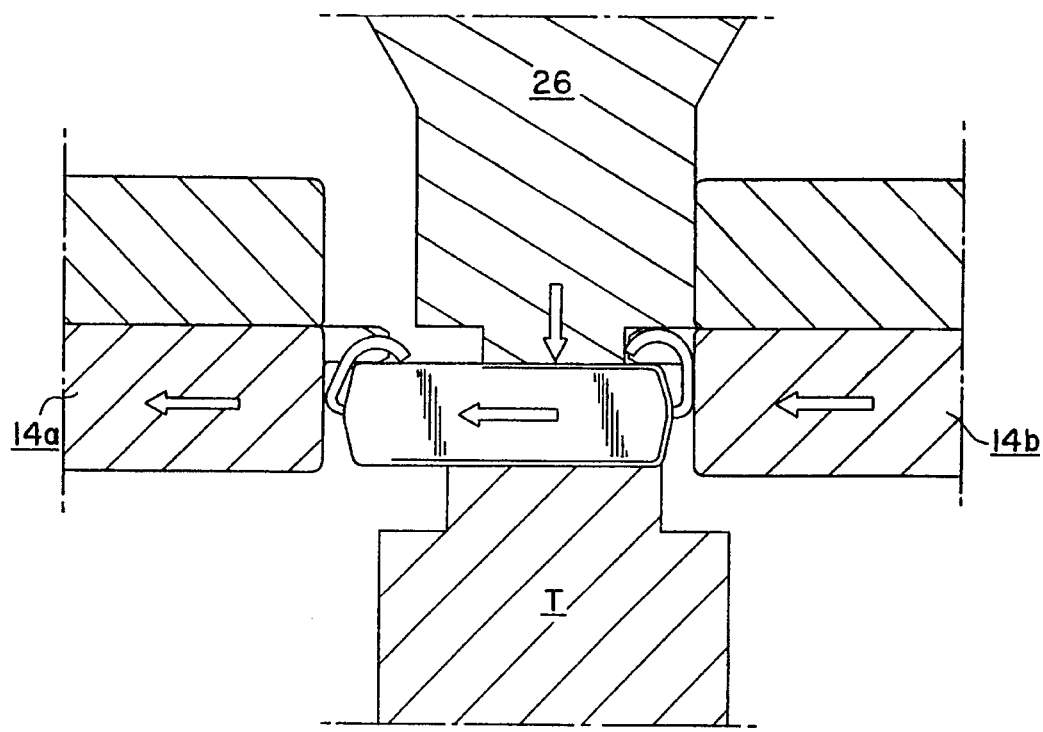
FIG. 4G is a transverse sectional view showing the phase for recurling the leads and to establish coplanarity for the leads along one row of J leads of the SOJ device.
Figure 4H:
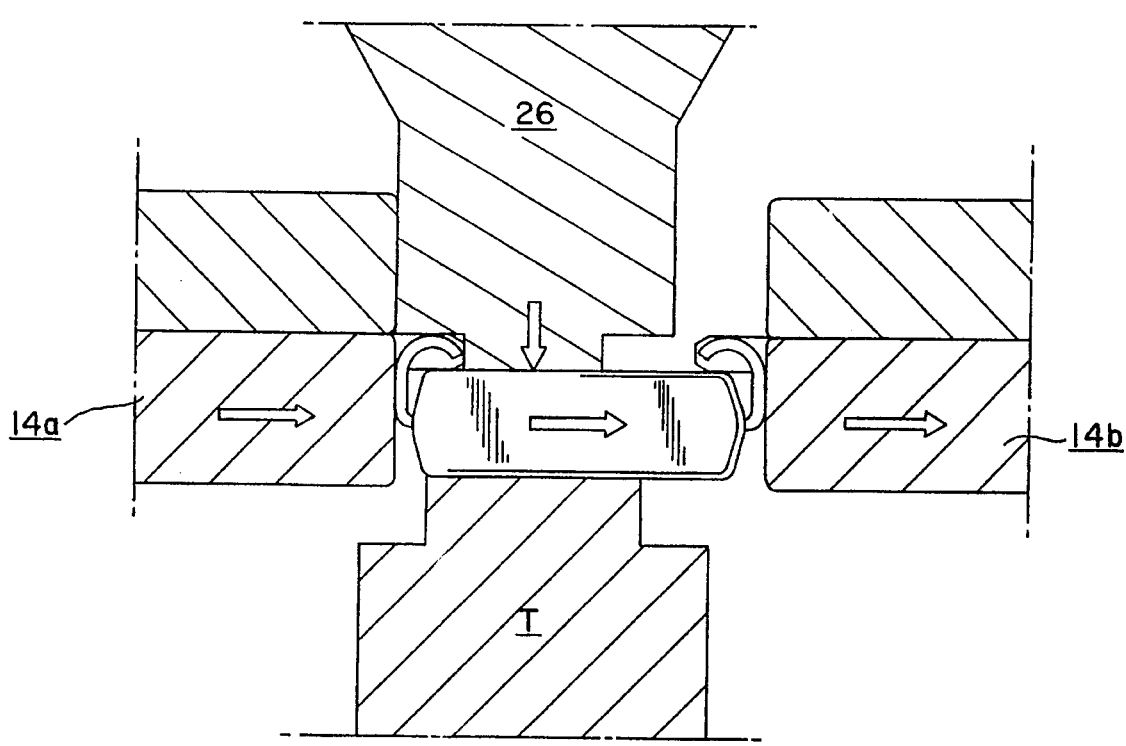
FIG. 4H is a view similar to FIG. 4G showing repositioning of the parts to recurl the J leads along the opposite row of J leads to establish proper co-planarity.

Thereafter, the clamping pressure of the anvil 26 is reduced from about 60 p.s.i. to about 10 p.s.i. and the slide assemblies 14a, 14b are now displaced laterally relative to the trackway T, first to the left as shown in FIG. 4G which reestablishes the lead peak height H for one row of leads and recurls the leads L in this row to establish coplanarity for this row. At this point the anvil pressure is increased to about 60 p.s.i. for the final phase of the stroke of the slide assemblies 14a, 14b to the left whereby the terminal ends of the leads in the right hand row engage the coplanarity and height forming faces of the anvil. The pressure of the anvil 26 is reduced again to about 10 p.s.i. and the slide assemblies 14a, 14b are displaced laterally in unison to the right and in the latter stages of this stroke, the pressure of the anvil is again increased to 60 p.s.i. so that the leads L in the left hand row are reformed in the same manner as described previously in connection with the right hand row. It is noted that the final phases of the recurling step produce forces tending to lift the anvil and thus the anvil pressure increase at the final phase of the reforming stroke is necessary to insure precise resetting of the height H of the J leads. When the slide assemblies have been fully displaced to the left, the pressure on the anvil is lowered to permit displacement of the slide assemblies and the SOJ device in the opposite direction.

With zero pressure on the anvil 26, the slide assemblies are moved to a centered position relative to the trackway T by a centering mechanism 220 to the position shown in FIG. 4E. A light pressure of about 10 p.s.i. is applied to the anvil 26 to support the SOJ device during the slide assembly return while the slide assemblies are retracted to prevent damage to the SOJ device and the blades. From this centered position, the slide assemblies 14a, 14b are moved outwardly from the trackway T then to the "home position" shown in FIG. 4B. The anvil 26 is then raised or retracted, the stop mechanism 30 is raised and an air jet urges the reformed SOJ device from the recondition and reforming station $S_f$ to be accumulated in a cartridge located at the pickup or discharge station $S_d$.

It is noted that the cycles described above and the variations in the pressure and the sequential operation of the various mechanism are controlled by a central processing unit.

Considering now more specifically the details and arrangement of the apparatus and consider first the singulating station $S_s$. The escapement mechanism best shown in FIGS. 6, 7 and 8 comprises an elongated stationary guide rail 40 and a retractable guide rail 42 moveable laterally relative to the trackway T for selectively retaining a row of SOJ devices at the singulating station $S_s$ and releasing them in a controlled fashion as described below. The stationary guide rail 40 and retractable guide rail 42 have confronting longitudinally extending faces 40a, 42a and each has a longitudinal lip 44 and 46 projecting inwardly from the faces 40a, 42a to define an elongated pocket or channel 47 defining an enclosed pathway for the leads L which travel down the trackway T in a "dead bug" position, that is, one wherein the top face of the body portion B rides on the trackway T and the rows of leads L face upwardly. The width of the pathway 47 may be selectively varied for different sized SOJ device and to this end there is provided an adjustably mounted pinch plate 48 forming one side of the channel or pathway 47 for the SOJ device. The pinch plate 48 may be repositioned longitudinally to engage the second SOJ device depending on length of the SOJ.

The retractable guide rail 42 is actuatable laterally relative to the trackway T between limit positions and the means for accomplishing this comprises a link 60 connected at one end to an air cylinder 62 and mounting a guide pin 64 at the opposite end which projects through an opening 66 in the top plate 12 of the housing and engages in a slot 68 in the retractable guide rail 42. When the air cylinder 62 is pressurized, the link 60 is drawn to the left with respect to FIG. 7 toward the trackway T to squeeze the incoming array of SOJ devices between squeeze plate 48 and rail 42 to lock the retractable guide rail 42 in its inner position.

Figure 6:
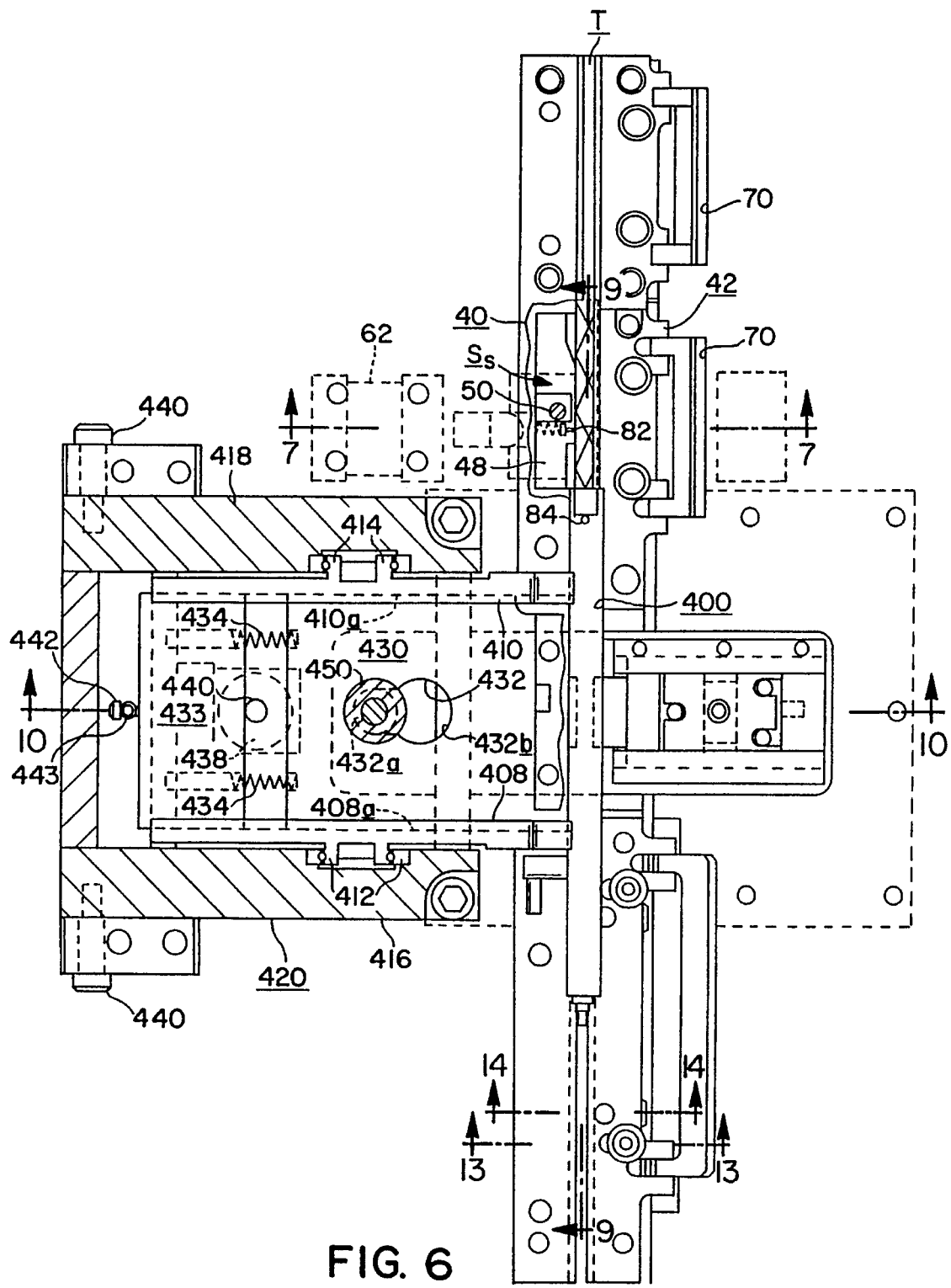
FIG. 6 is an enlarged plan view as viewed on lines 6—6 of FIG. 1.
Figures 7, 8:
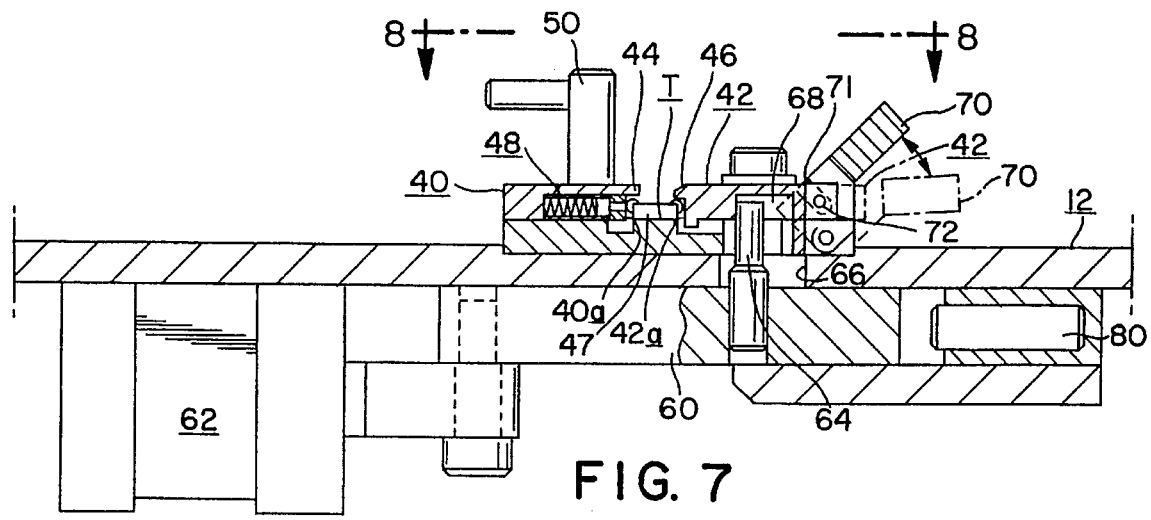
FIG. 7 is an enlarged fragmentary sectional view taken on lines 7—7 of FIG. 6 showing the details of the singulating station.
FIG. 8 is a fragmentary plan view taken on the line 8—8 of FIG. 7 showing additional details of the singulating station.

The singulating station shown in FIGS. 6–8 includes a spring biased stop pin 82 mounted in adjustable plate 48 where project laterally into the channel 47 for the SOJ devices. The pin 82 is located upstream from the escapement pin 84. Accordingly, as illustrated in FIG. 8, the stop pin 82 provides a snagging stop for the second SOJ device in line when the escapement pin 84 (See FIG. 9) is raised to release the lead SOJ device for entry into the reconditioning and reforming station $S_f$. The spring biased pin 82 functions to hold the line of SOJ devices upstream in a situation where SOJ device #3 is wider, for example, than SOJ #2. By this arrangement, SOJ #2 is retained in place when the lead SOJ is released and thus the mechanism insures that only one SOJ device at a time is automatically released to the reconditioning and reforming station $S_f$. The pin 82 only protrudes a short distance in the range of 0.015 to 0.022 and as illustrated indexes between adjacent leads L of the second SOJ device in line.

In summary, when the singulating pin 84 is retracted to release the lead SOJ device, it is out of the range of the squeeze rails in the singulating station and moves by gravity to the reconditioning and reforming mechanism. Lowering of the singulating pin 84 also triggers actuation of the air cylinder 62 for the retractable guide rail to increase the gap and release the SOJ devices so that they can move forwardly to position the next SOJ device after the singulating pin 84 is returned to a downward position.

Release of air pressure on air cylinder 62 permits manual displacement of the retractable guide rail 42 by means of a pivotally mounted handle 70 having a slotted opening 71 which engages a pin 72 on the retractable guide rail 42. An operator can enlarge the pathway 47 and increase the distance between the rails 40 and 42 by depressing the handle 70 toward the top plate 12 thereby displacing the retractable guide rail 42 laterally outwardly to an opened position (broken line) and permitting access to the trackway T in the event of jamming of SOJ devices at the singulating station. This permits clearing the trackway T. The outer limit position of the guide pin is determined by an adjustable stop screw 80.

Figure 9:
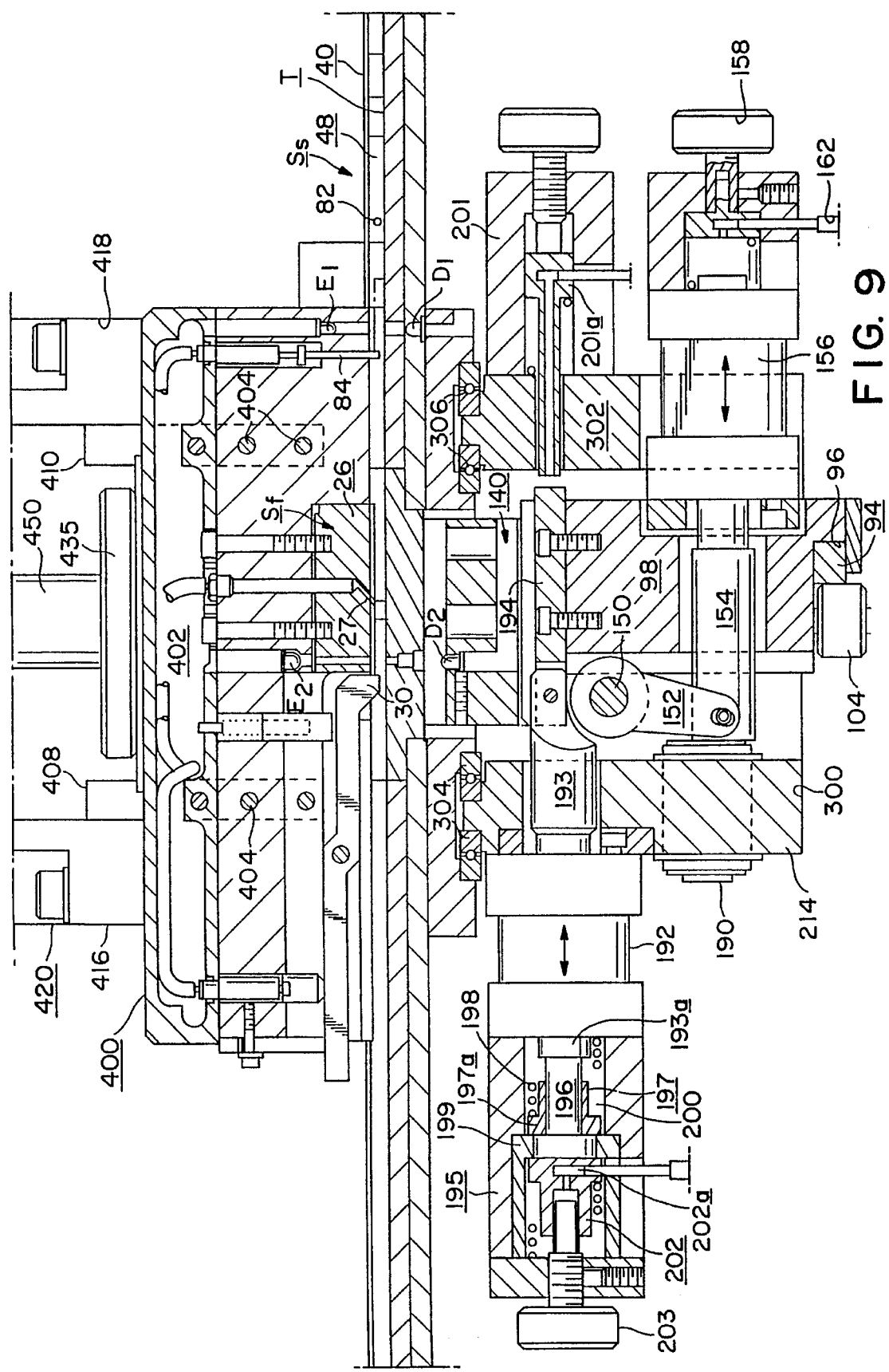
FIG. 9 is a greatly enlarged fragmentary sectional side elevational view taken on the line 9—9 of FIG. 6 showing details of the elements contained within the clamping and forming block housing overlying the trackway centerline and certain details of the elements utilized in movement of the slide assemblies and their associated combs which underlie trackway centerline.

As shown in FIG. 9 an infrared emitter $E_1$ and detector $D_1$ are located adjacent the escapement pin 84 to signal presence of SOJ in the singulating station and that an SOJ can now be singulated to the reforming and reconditioning station. The machine can now be cycled. When the lead SOJ device is released by the escapement pin 84, it moves to the straightening station $S_f$ where the lead edge $B_1$ abuts the stop 30 and is detected by an infrared emitter $E_2$ and detector $D_2$ located at that station. This initiates the reconditioning sequence.

Figure 10:
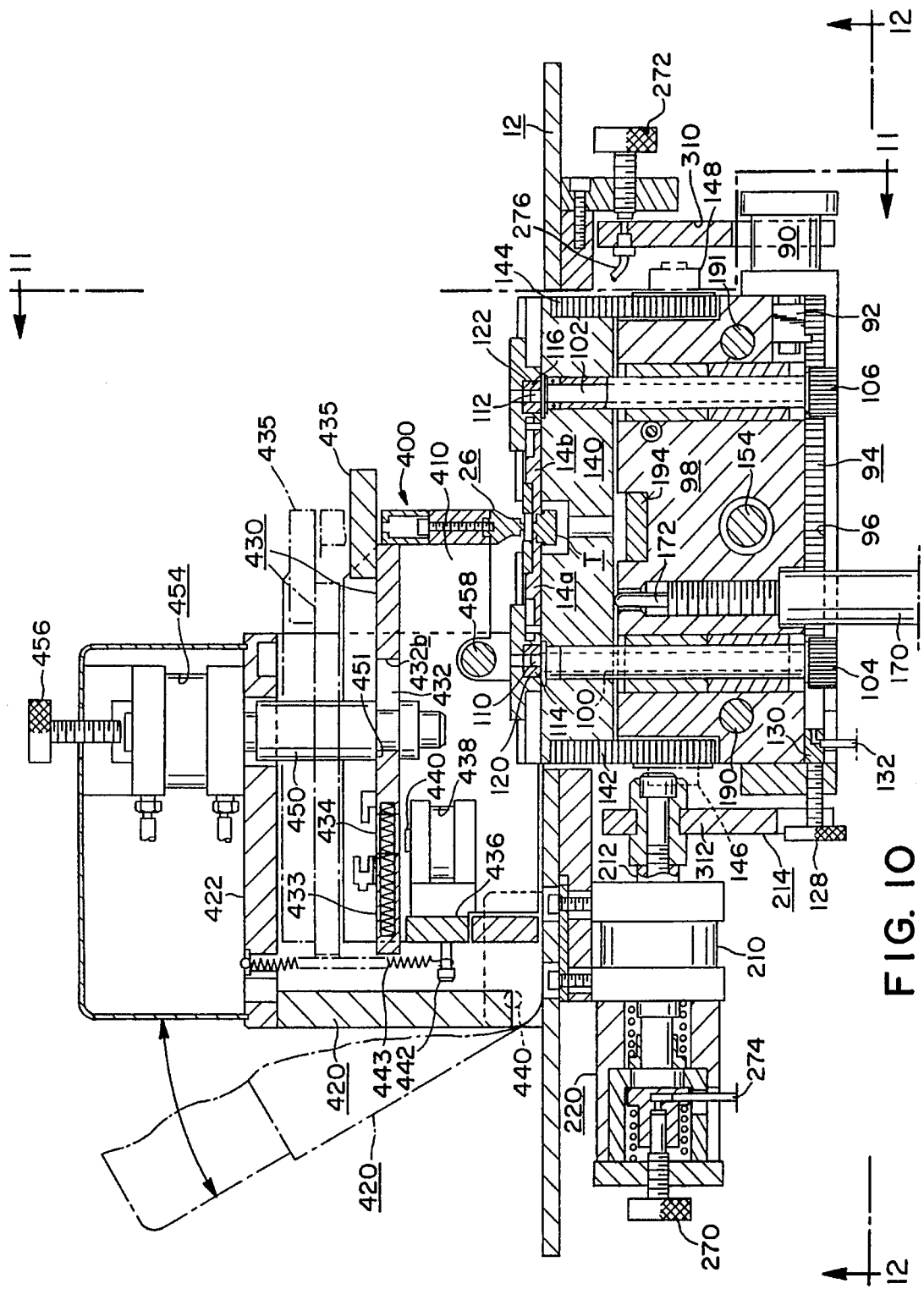
FIG. 10 is a fragmentary transverse sectional elevational view taken on the line 10—10 of FIG. 6 showing specific details of the elements comprising the SOJ lead straightening and reforming station.

Considering now more specifically the mechanisms at the reforming and reconditioning station for the sequence of operations described above in FIGS. 4A–4J inclusive, the mechanism for simultaneous outward displacement of the slide assemblies 14a, 14b relative to the trackway T is best shown in FIG. 10. As illustrated therein, the mechanism comprises a piston cylinder 90 having an actuator 92 keyed to an elongated toothed rack 94 extending transversely of the trackway T and slidable in a way 96 in central block housing 98. A pair of vertical shafts 100 and 102 are bearingly supported in the central block housing 98, the shafts 110 and 112 having pinions 104 and 106 in meshing engagement with the toothed rack 94. The shafts 110 and 112 mount eccentric stub shafts 110 and 112 engagable in slide blocks 114 and 116. The slide blocks 114 and 116 in turn fit in guide pockets 120 and 122 of slide assemblies 14a, 14b. Accordingly, with the slide assemblies in the "home position" illustrated in FIGS. 4B and FIG. 10, activation of the piston cylinder 90 moves the rack 94 in a transverse direction outwardly to the left with respect to FIG. 10 to rotate shafts 110 and 112 in a counterclockwise direction in turn displacing slide assemblies 14a and 14b outwardly in opposite directions relative to the trackway T as shown in FIG. 4C.

The outer limit position of the slide assemblies 14a and 14b may be fine tuned or adjusted by a threaded adjustment screw 128 positioning a limit block 130 in the way 96 to engage the rack 94 at its outer end. In the outer limit position of the slide assemblies 14a and 14b, the rack 94 engages the adjustable sensing block 130 connected to an air pressure sensing line 132.

Considering now more specifically the mechanism for raising the slide assemblies 14a and 14b from a lower limit position below the body portion B of the SOJ and aligned with the side walls to an upper limit position to thereby, align the leads L in parallel array and fix the S dimension referred to as perpendicularity. More specifically, the mechanism moves the slide assemblies from the broken line position in FIG. 4D to the solid line positions. With reference to FIGS. 9–12 an elongated slide carriage 140 below the trackway T is movable in a vertical direction relative to the central block housing 98 between upper and lower limit positions. The carriage 140 carries the slide assemblies 14a and 14b and mounts at its outer end elongated racks 142 and 144 which mesh with quadrant gears 146 and 148 connected by a common shaft 150. Air cylinder 156 produces oscillating movement of the shaft 150 through actuator 154 and bifurcated link 152 connected at one end to the shaft 150 and at its opposite end to the actuator 154. The stroke of the cylinder 156 may be selectively adjusted by adjusting screw 158 to control the stroke of the piston 156 and thereby vary the upper limit position of the slide assemblies. The piston cylinder 156 also includes sensing means 162 connected through the logic system to affect timed actuation of the straightening sequence in the manner described above.

An encoder 170 (See FIG. 10) having a displaceable sensing head 172 is operatively associated with the slide carriage 140 to track the precise location of the upper and lower position of the slide assemblies 14a and 14b.

With the slide assemblies 14a and 14b positioned as shown in FIG. 4E in vertical alignment with the bottom face of the SOJ device, means is provided for actuating the slide assemblies inwardly toward one another so that the fingers 16a and 16b engage in the reforming pockets $C_f$. When the slide assemblies 14a and 14b are aligned as shown in FIG. 4D, the air cylinder actuator 90 is triggered or actuated to move the slide assemblies 14a and 14b inwardly toward one another such that the fingers 16a and 16b interengage between the leads L on both sides of the SOJ body and affect further straightening of the "pin to pin" relationship or S distance. With the slide assemblies in the position shown in FIG. 4E, means are provided for oscillating the slide assemblies back and forth in unison. As shown by the arrows in FIG. 4F, the purpose of doing this is to establish the S relationship between the leads and correct for lead spring back. Air cylinder 192 is a two ended actuator type. The right hand actuator 193 of air cylinder 192, as shown in FIG. 9 is connected to an actuator block 194 bolted to the central block housing 98.

The left hand actuator 193a of the air cylinder 192 is connected to recentering mechanism 195 for recentering the piston of the air cylinder 192 when the air pressure is off, thereby recentering the central block housing 98 and the slide carriage 140 after the cycling action of the air cylinder 192.

The piston recentering mechanism 195 consists of a headed extension rod 196 secured to the terminal end of the left hand actuator 193a. A slidable collar 197 having a flanged end 197a is mounted on the extension rod 196. A spring 198 biases the collar 197 against the headed actuator extension rod 196 moving the piston of air cylinder 192 to a mid-point position, when the air pressure is off, and the flange 197a abuts a shoulder 199 positioned midway in the inner bore 200 of the recentering mechanism 195.

When the air cylinder actuator 193 is actuated to the right, with reference to FIG. 9, the actuator block 194 travels a required distance to the right and comes in contact with an adjustable spring biased limit stop 201 provided with air sensing means 201a. Air pressure to cylinder 192 is reversed moving the headed actuator extension rod 196 to the left until the adjustable spring biased limit stop collar 202 provided with air sensing means 202a is brought up against the terminal end of adjustment screw 203 shutting of the air sensing means. When the required number of cycles of the air cylinder 192 has been achieved, the air pressure to the cylinder 192 is terminated, the spring biased collars 202 return the headed actuator rod 196 to the mid point of the bore 200 which in turn recenters the central block housing 98 and the slide carriage 140. The movement of the central block housing 98 and the slide carriage 140 is accurately measured on both sides of the centerline position by an encoder 206.

At this point in the cycle, the SOJ leads L have been corrected for "peak to peak" dimension S and the oscillating process has aligned all of the leads in a plane E—E perpendicular to the longitudinal axis of the SOJ body B. The next phase in the cycle then is to work the leads L so that the apex $L_p$ in the opposing rows are spaced apart a distance C and the apex $L_p$ of the two rows of leads L all lie in a common plane P—P, thus achieving recurling and coplanarity and lead body off set of the leads L. To this end, as described above, the slide 14a and 14b assemblies are actuated in unison first in one lateral direction relative to the trackway T and anvil 26, for example to the left as shown in FIG. 4G whereby the SOJ device is moved to the left by the slide assembly 14b and the leads L are confined in the reformed pocket $C_f$ in the face of the anvil 26. Engagement of the free terminal ends of the leads L against the vertical face 36b results in repositioning and recurling the leads L in an upright position as shown in FIG. 4G and the engagement of the apex of the leads L against the horizontal face 34b of the pocket $C_f$ ensures positioning the apex of all the leads in the plane P—P. Reversal of slide assemblies 14a and 14b in unison to the right performs the same function for the row of leads L on the left hand side of the SOJ device.

Figure 11:
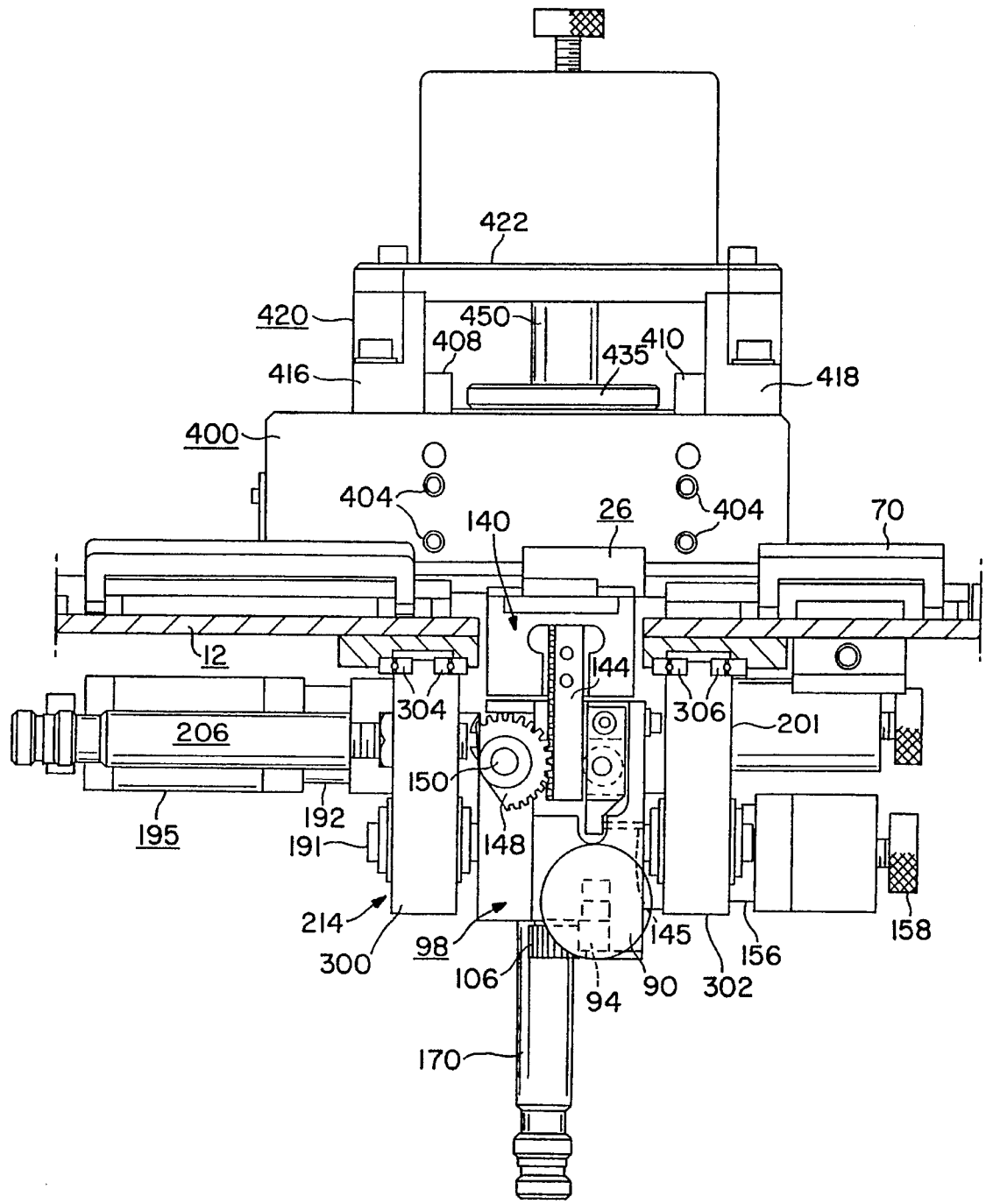
FIG. 11 is a fragmentary side elevational view taken on the line 11—11 of FIG. 10 showing additional details of the elements comprising the lead straightening and reforming station.
Figure 12:
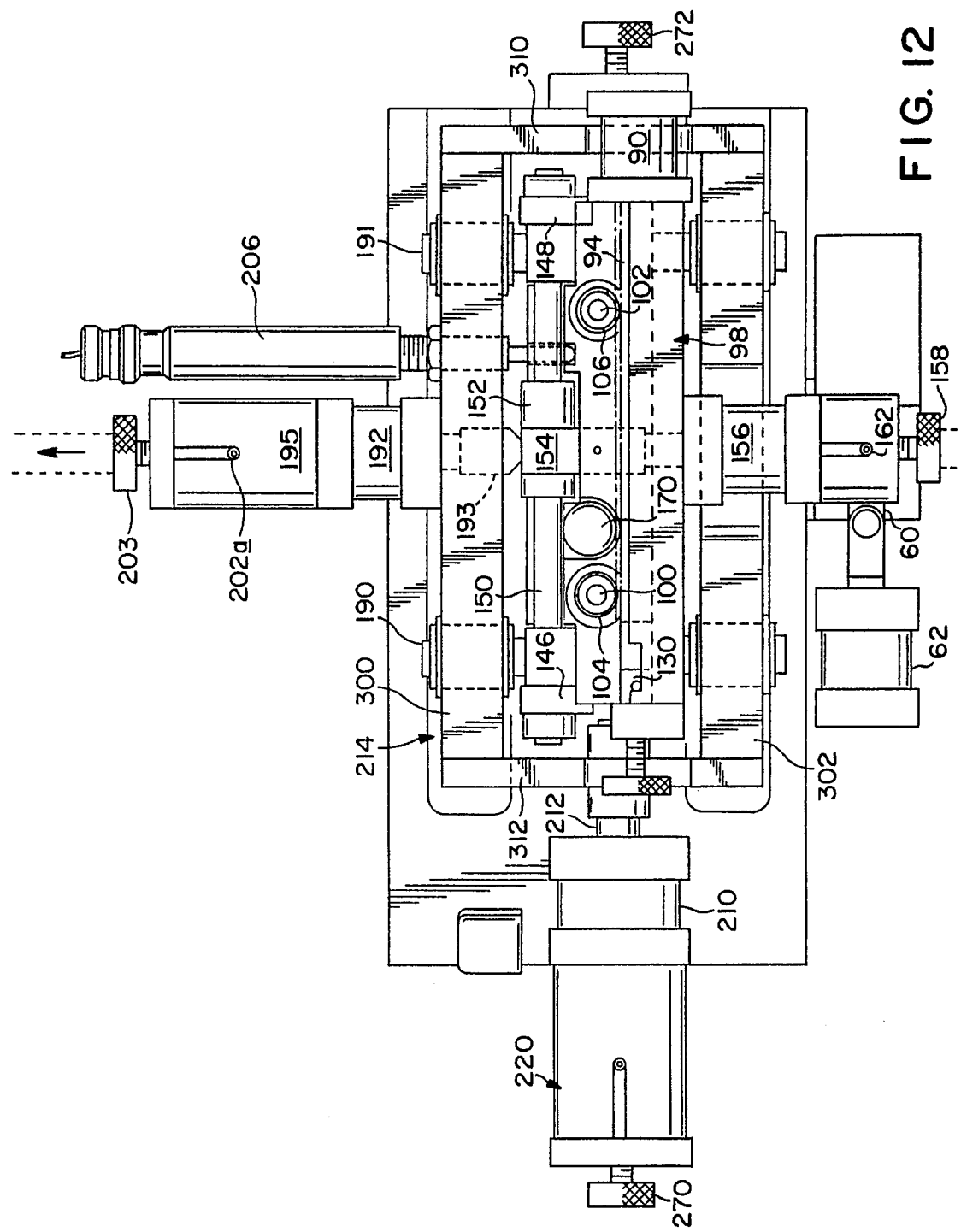
FIG. 12 is a bottom plan view taken on the line 12—12 of FIG. 10 showing additional details of the elements comprising the lead straightening and reforming mechanism.
Figure 13:
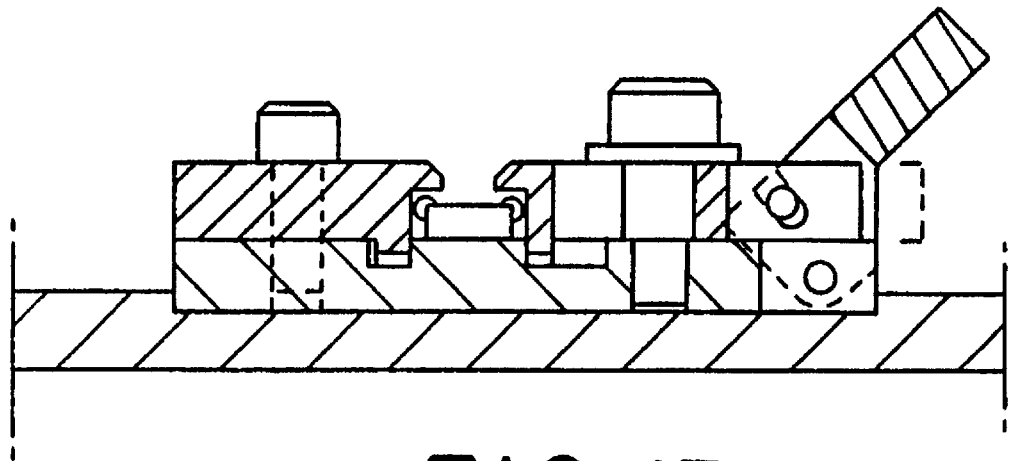
FIG. 13 is an enlarged fragmentary sectional elevation view taken on the line 13—13 of FIG. 6 showing details of the manually operated spring biased quick part release to permit easy and fast removal of jammed parts.
Figure 14:
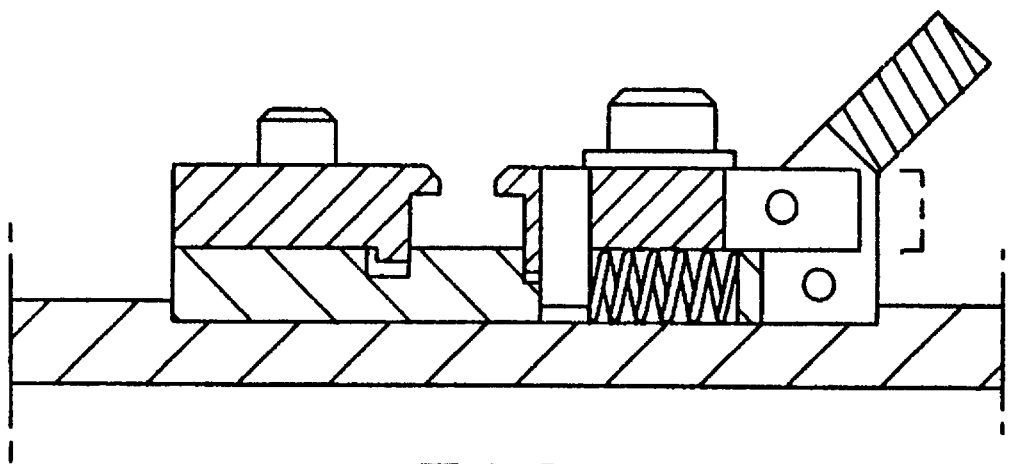
FIG. 14 is an enlarged fragmentary sectional elevational view taken on the line 14—14 of FIG. 6 showing additional details of the quick release mechanism shown in FIG. 13.

The mechanism for cycling the slide assemblies 14a and 14b in the manner described above, is best illustrated in FIGS. 10 and 12 and comprises a self-centering air cylinder 210. The double acting piston includes a piston actuator rod 212 moveable between inner and outer limit positions and is connected at its outer end to a centering assembly carriage 214 which as illustrated in FIGS. 10 and 11 serves as a cradle or embraces the central block housing 98, and the slide assembly carriage 140. Thus, when the piston rod 212 is actuated by air pressure to its left hand limit position, the carriage 214 and the associated housings carrying both slide assemblies 14a and 14b are simultaneously actuated an equal increment to the left as shown in FIG. 4G. Reversal of air pressure in the air cylinder 210 produces a reverse movement of the centering carriage 214 and associated elements including the slide assemblies 14a and 14b to the right in the manner shown in 4H.

Figure 4I:
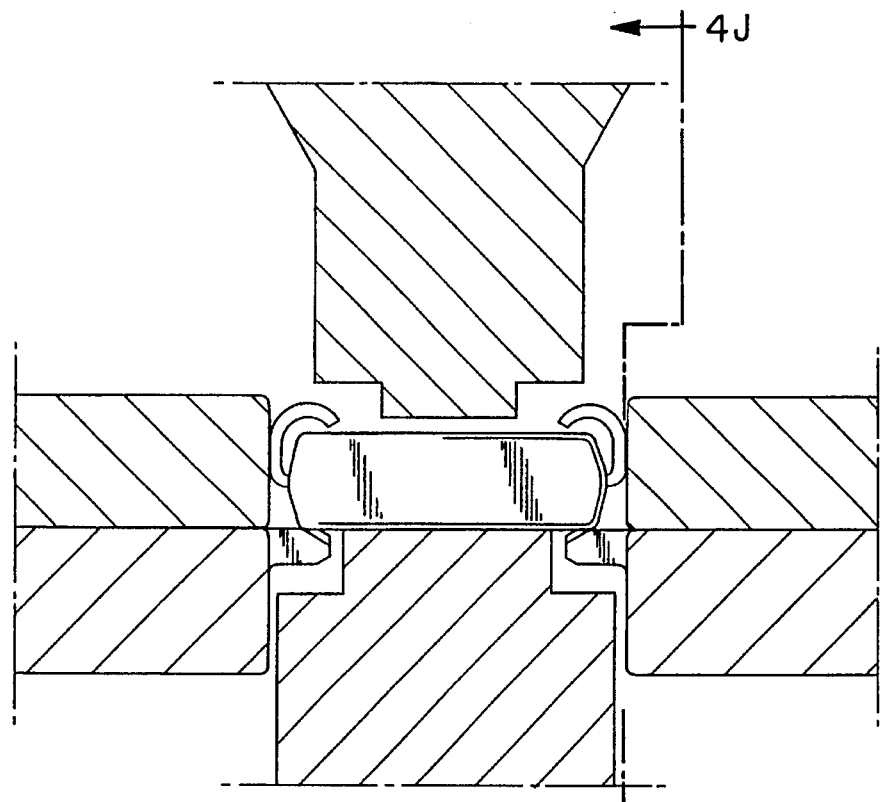
FIG. 4I showing the terminal end of the cycle a reformed SOJ device and return of the parts to the home position as shown in FIG. 4B.
Figure 4J:
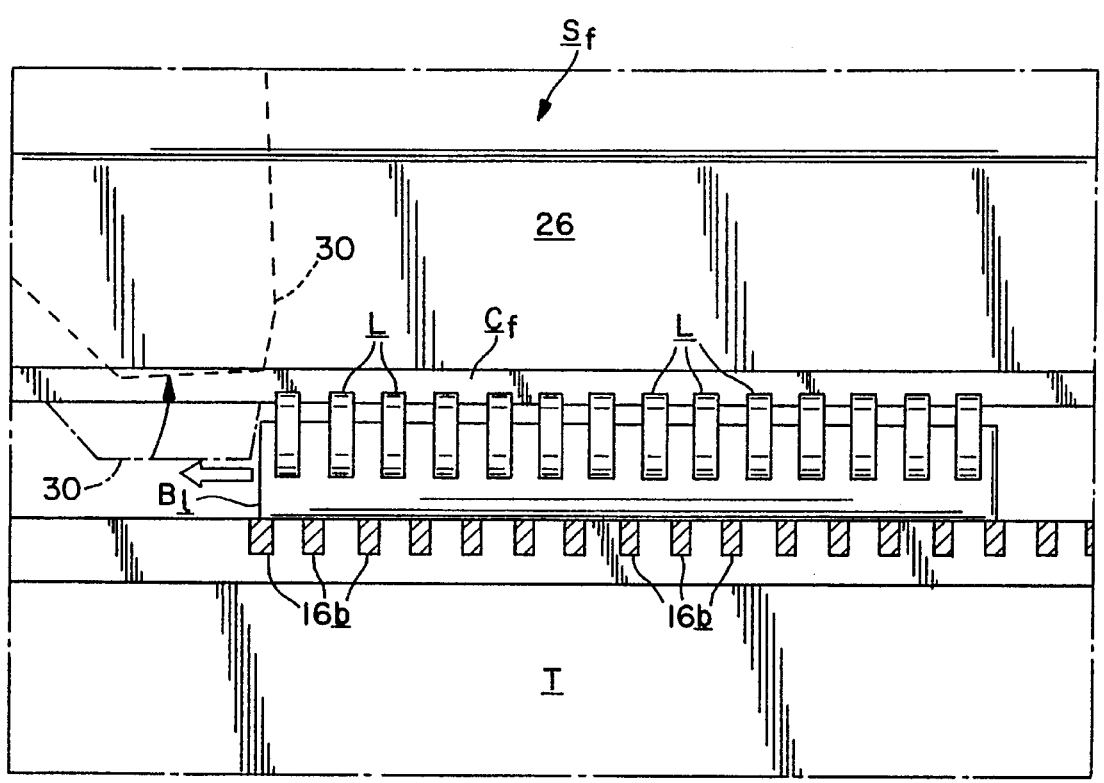
FIG. 4J is an enlarged fragmentary side elevational view taken on lines 4J—4J of FIG. 4I showing the reformed SOJ device in position for discharge from the forming station.
Figure 5:
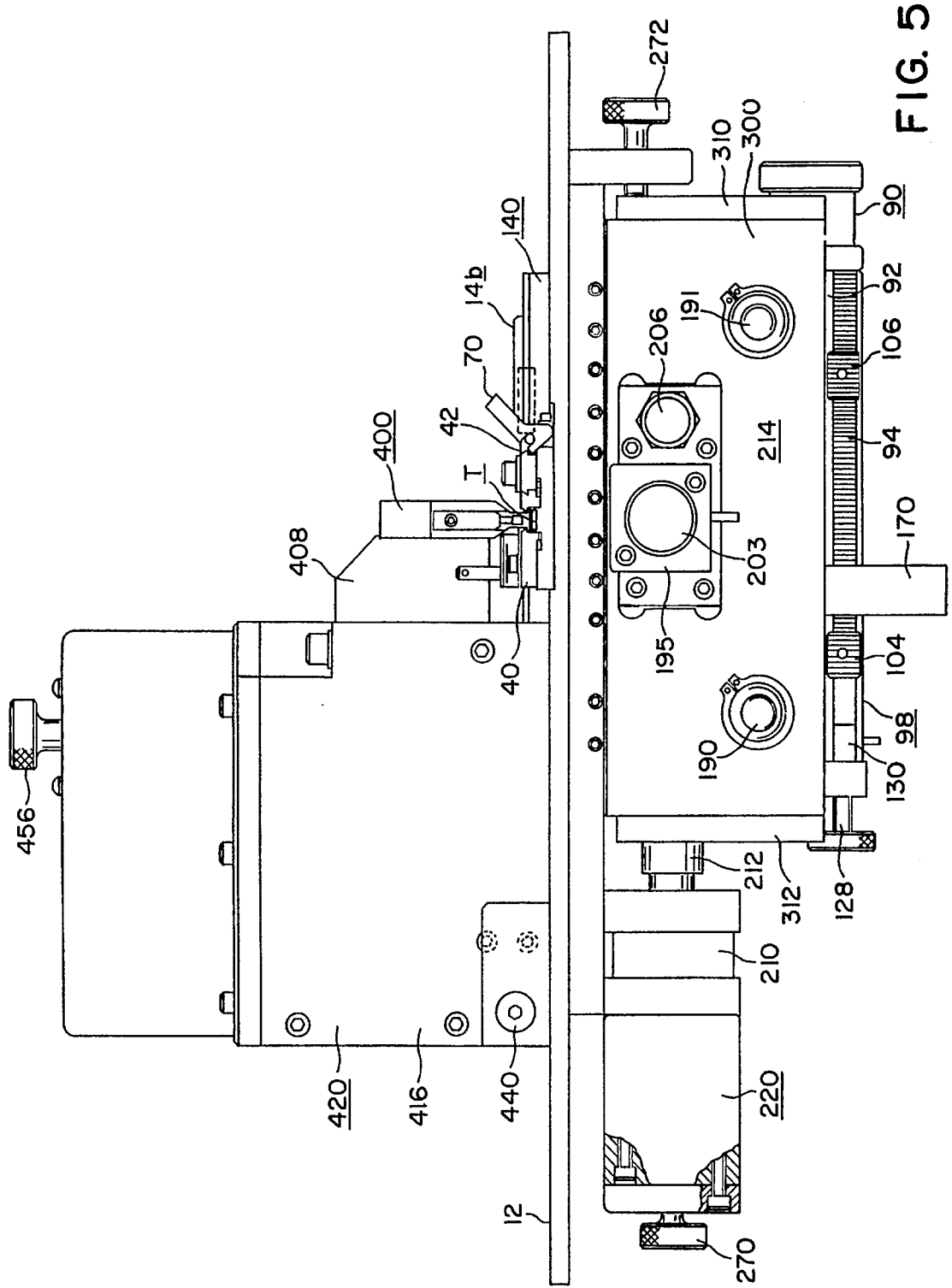
FIG. 5 is an enlarged fragmentary end elevational view of the apparatus for straightening the leads of an SOJ device as viewed on line 5—5 of FIG. 1.

When the cycle described above to achieve recurling and vertical alignment and coplanarity is achieved, means are provided for automatically recentering the carriage 214 so that the slide assemblies can be retracted and lowered to the home position shown in FIG. 4I. To this end, the automatic centering mechanism, broadly designated by the numeral 220 is provided and functions in the same manner as cylinder 192 and recentering assembly 195 previously described. The extreme outer left and right limit position for the slide assemblies 14a and 14b may be adjusted by adjustment screws 270 and 272. Air sensors 274 and 276 are associated with each adjusting screw in each case to signal limits for actuating the slide assemblies between opposing limit positions.

The various housings described above nest and are cooperatively mounted to produce the complex articulated movements described and the best views showing the inter-relationships and inter-engagements of these housings and actuating mechanisms is best shown in FIGS. 9, 10, 11 and 12. As shown therein, the centering carriage 214 comprises a pair of elongated spaced rectilinear blocks 300 and 302 connected to the main frame via slide bearings 304 and 306. The centering carriage 214 further includes a pair of end plates 310 and 312 connect to opposite ends of the blocks 300 and 302. An air cylinder actuator 210 is connected to one of the end plates 312. As illustrated, shafts 190 and 191 are journalled in the blocks 300 and 302 to support the centering block housing 98 for slidable movement between the blocks 300 and 302 in the manner described above.

Further, the slide assembly carriage 140 is supported relative to the block housing 98 for up and down motion by means of the shafts 100 and 102. Thus, the central block housing 98, slide assembly carriage 140 and centering carriage 214 form a compact network of elements which move relative to one another to produce the various cyclic movements of the combing operation described above and illustrated schematically in FIG. 4A–4J inclusive.

It is noted that during the recurling portion of the straightening and reforming cycle described above, large forces are induced in the various support and actuating mechanism for the slide assemblies which may cause flexing in the system and result in precise reforming and recurling of the leads. Thus, an important by product of the slide assembly support and actuating system is that the elongated shaft 150 functions as a torsion bar which combines with the gear racks 144 and pins 148 to absorb and stabilize the slide assemblies during the recurling cycle when large forces are induced in the system.

The anvil 26 is mounted for vertical displacement during the cycles described above and is also part of an overall assembly and can be pivoted relative to the housing to expose the trackway T for set up and trouble shooting. Thus, the anvil 26 is secured within a relatively thin rectangular box 400 which overlies the trackway T as shown in FIGS. 6, 9 and 10. The box 400 contains additional elements previously described. The elements in order from the leading end of the box to its trailing edge are as follows: an emitter diode $E_1$, an air activated, spring return, singulating pin 84, the anvil block 26, having an angled air jet channel 27, emitter $E_2$ followed by an air activated spring return pivoted stop lever 30. The uppermost third of the box 400 has a cavity 402 for interconnecting air lines and electrical wires. The box 400 is fixedly attached by means of screws 404 to the outermost ends of two spaced apart vertically extending arms 408 and 410,(see FIG. 6). The arms 408 and 410 are mounted for vertical movement in bearings 412 and 414 disposed in the vertically extending sidewalls 416 and 418 of a pivotally mounted block housing 420. An actuator plate 430 is interposed between the arms 408 and 410 and slidably mounted in grooves 408a and 410a formed in the arms 408 and 410. The central portion of the actuator plate 430 has an elongated slotted opening 432 (see FIG. 6). The left hand portion of the slot 432 has a semicircular portion 432a which embraces a notch 451 in the lower terminal end of the actuator 450 of air cylinder 454. The slot 432 has a right hand circular opening 432b slightly larger in diameter than the actuator 450. A pair of springs 434 biased between a fixed plate 433 and the slidable actuator plate 430 normally keeps the actuator plate 430 engaged with the air cylinder 454 and actuator 450. The right hand terminal end of the actuator plate 430 is equipped with a push tab 435. A cross bar 436 is fixedly attached between the arms 408 and 410 below the plate 433 and mounts on its inner face an air cylinder 438 and an actuator 440. Actuator 440 is up when air pressure is on and down when air pressure is off. Bar 436 mounts on its outer face a machine screw 442 retaining one end of a spring 443. The other end of the spring 443 is anchored in the top plate 422 of block housing 420. With the air pressure "off", push tab 435 may be depressed inwardly, toward the block housing 420, thereby moving the actuator plate 430 inwardly. This motion is not inhibited by the actuator 440. Since the air pressure is "off" when the aperture 232b aligns with the diameter of the actuator 450, the box 400 and arms 408 and 410 and its entire assembly rise vertically away from the track T to the position shown by the dot and dash line in FIG. 10 by action of the spring 443. When even more clearance is required as for setup, the block housing 420 and its entire assembly just described may be pivoted rearwardly away from the trackway T as shown in FIG. 10 about shouldered pivot screws 440.

Clamping and unclamping clearance of the SOJ device on the trackway T at the reforming and reconditioning station $S_f$ is accomplished by air cylinder 454, actuator 450, actuator plate 430, arms 408 and 410, and box 400 which mounts as stated above the anvil 26. The unclamping clearance of the anvil 26 above the SOJ device at the forming station $S_f$ is established by means of the adjustment screw 456. The downward limit stroke of the anvil 26 is established by means of the cross bar 458 spanning between and secured to the side walls 416 and 418 of the block housing 420.

While a particular embodiment of the invention has been illustrated and described herein, it is not intended to limit the invention and changes and modifications may be made therein within the scope of the following claims.

What is claimed is:

1. A method for reconditioning leads of a device having a body portion with at least one planar face disposed in a predetermined plane and at least one row of generally J-shaped leads extending angularly from the body portion comprising the steps of:

supporting the device between an anvil having reforming surfaces and a support surface; and displacing at least one slide assembly and anvil relative to one another in the general direction of said predetermined plane to reform the leads to conform to predetermined peak-to-peak and coplanarity parameters.

2. A method as claimed in claim 1, including the step of oscillating the slide assembly with the fingers of the slide assembly engaging between the curled terminal ends.

3. A method as claimed in claim 1, including the step of lowering clamping pressure holding the device in place during an initial phase of the reforming step to permit a limited amount of movement of the device and then increasing clamping pressure during a final phase of the reforming step.

4. A method as claimed in claim 1, including the step of reciprocating the slide assembly back and forth while it is engaging between curled terminal ends of the leads to effect perpendicularity of the leads.

5. A method as claimed in claim 1, including the additional step of returning the slide assembly to a home position after the reforming step and reducing the pressure on the device during this return phase of the cycle.

6. A method as claimed in claim 1, including the step of automatically feeding one device at a time to the reforming station by singulating means.

7. A method as claimed in claim 1, including the step of reciprocating the slide assembly back and forth while it is engaging between curled terminal ends of the leads to effect perpendicularity of the leads.

8. A method as claimed in claim 1 including securely clamping the device after the termination of a combing cycle and oscillating the slide assemblies to their upper most limit position wherein the fingers engage between the leads of the two rows whereby oscillation of the slide assemblies in a direction longitudinal to the trackway effects reestablishing the lead to lead clearance between the leads.

9. In a system for reconditioning leads of a device having a body portion with at least one planar face disposed in a predetermined plane and at least one row of generally J-shaped leads extending angularly from the body portion at least one row of J-shaped leads extending, a reforming station including an anvil having reforming surface; and at least one slide assembly; and means for displacing the anvil and slide assembly relative to one another in the general direction of said predetermined plane to thereby reform the leads to conform to predetermined peak-to-peak and coplanarity parameters.

10. Apparatus for reforming leads of a device having a body portion with at least one planar face disposed in a predetermined plane and at least one row of generally J-shaped leads extending angularly from the body portion comprising;

an anvil having reforming surfaces, at least one slide assembly having reforming means confronting the row of leads, and means for displacing the anvil and slide assembly relative to one another in the general direction of said predetermined plane to thereby reform the leads to conform to predetermined peak-to-peak and coplanarity parameters comprising a piston cylinder having an actuator keyed to an elongated toothed rack slidable in a way in a central block housing, a pair of shafts supported in the block housing having pinions in meshing engagement with the toothed rack, eccentric stub shafts carried by the vertical shafts whereby activation of the piston cylinder moves said rack in a traverse to rotate vertical shafts thereby displacing slide assemblies inwardly and outwardly in opposite directions in said predetermined plane.

11. Apparatus for reforming leads of a device having a body portion with at least one planar face disposed in a predetermined plane and at least one row of generally J-shaped leads extending angularly from the body portion comprising;

a trackway, an anvil having reforming surfaces, at least one slide assembly having reforming means confronting the row of leads, means for displacing the anvil and slide assembly relative to one another in the general direction of said predetermined plane to thereby reform the leads to conform to predetermined peak-to-peak and coplanarity parameters; and a mechanism for actuating the slide assemblies in a direction transverse to said predetermined plane to comb the leads comprising an elongated slide carriage below the trackway moveable in a vertical direction relative to a block housing, said carriage carrying the slide assemblies mounting at its outer end elongated racks with quadrant gears connected by a common torsion shaft member, and an air cylinder means for oscillating said quadrant gear shaft.

* * * * *